United States Patent
Sedlak et al.

(10) Patent No.: US 7,167,388 B2
(45) Date of Patent: Jan. 23, 2007

(54) INTEGRATED CIRCUIT AND METHOD FOR OPERATING AN INTEGRATED CIRCUIT

(75) Inventors: Holger Sedlak, Sauerlach (DE); Thomas Kunemund, Munich (DE)

(73) Assignee: Infineon Technologies AG, Munich (DE)

( * ) Notice: Subject to any disclaimer, the term of this patent is extended or adjusted under 35 U.S.C. 154(b) by 64 days.

(21) Appl. No.: 10/854,928

(22) Filed: May 26, 2004

(65) Prior Publication Data

US 2004/0252550 A1  Dec. 16, 2004

(30) Foreign Application Priority Data

May 26, 2003  (DE) ................ 103 23 863

(51) Int. Cl.
*G11C 11/00* (2006.01)
(52) U.S. Cl. .................. 365/154; 365/203; 365/156
(58) Field of Classification Search ............. 365/154, 365/203, 156
See application file for complete search history.

(56) References Cited

U.S. PATENT DOCUMENTS

| | | | |
|---|---|---|---|
| 5,644,547 A | 7/1997 | Grishakov et al. | |
| 6,091,629 A * | 7/2000 | Osada et al. | 365/156 |
| 6,487,127 B2 * | 11/2002 | Johnson et al. | 365/189.05 |
| 6,876,557 B2 * | 4/2005 | Hsu et al. | 365/49 |
| 6,934,181 B2 * | 8/2005 | Chu et al. | 365/154 |
| 2003/0084336 A1 | 5/2003 | Anderson et al. | |

FOREIGN PATENT DOCUMENTS

| | | |
|---|---|---|
| JP | 5-129565 A | 5/1993 |
| JP | 6-44783 A | 2/1994 |
| JP | 7-161188 A | 6/1995 |

* cited by examiner

*Primary Examiner*—David Lam
(74) *Attorney, Agent, or Firm*—Dickstein Shapiro LLP

(57) ABSTRACT

An integrated circuit having at least one line pair to which a dual-rail signal is applied, a switching device, which is connected to the at least one line pair, is controlled by a signal applied to a control connection and is used to transmit the dual-rail signal, which has been applied to the line pair, to an additional line pair, and a memory cell, which is connected to the additional line pair and to a supply potential connection via a controllable switch.

15 Claims, 4 Drawing Sheets

INTEGRATED CIRCUIT AND METHOD FOR OPERATING AN INTEGRATED CIRCUIT

CROSS-REFERENCE TO RELATED APPLICATION

This application claims priority to German Patent Application No. 10323863.8, which was filed on May 26, 2003 and is incorporated herein by reference in its entirety.

FIELD OF THE INVENTION

The application relates to an integrated circuit, particularly a storage register, and to a method for operating the integrated circuit.

BACKGROUND OF THE INVENTION

Located at the heart of the processing unit in modern microprocessors and microcontrollers—the "Central Processing Unit" (CPU)—is the data path, which represents the interconnection of all functional units for processing data. Interconnection is effected by means of line bundles ("data buses") and encompasses, inter alia, the following functional units: multiplexer, arithmetic-logic unit (ALU), shifter and register file. The design and interaction of the functional units of data paths are sufficiently well known to a person skilled in the art, with the result that a more precise description will be dispensed with.

Only the register file (a "storage register") is of interest below. The register file is first of all used to (buffer) store addresses and data which are required for the task currently being handled by the CPU. This means that the register file may be regarded as being a type of "scratchpad memory". It also serves the purpose of fast, random and simultaneous read access to, in general, at least two operands in the ALU. The intention is also to enable fast, random write access at the same time as read access operations. This is known as "write back" and is used to write back (intermediate) results of arithmetic operations in the ALU. Finally, it is used to load data into the register file and to remove addresses and data from same. The sense and purpose is to communicate with system parts outside the data path in the CPU.

In order to be able to satisfy all these requirements using as little surface area and power as possible, register files or storage registers are in the form of "multiport RAMs" (Random Access Memories). The latter are registers which are interconnected by means of their bit line bundles, with the functional unit "register" being defined as a quantity of identical "single-bit register cells" having the characteristics listed above. The number of bits which can be stored in a register generally corresponds to the bit width of the data path. The number of ports constituting a switching device corresponds to the maximum number of different access operations intended to be simultaneously possible to different registers.

Data paths in modern microprocessors and microcontrollers are usually designed using "single-rail" circuitry. In the case of said data paths, each bit of information to be processed is physically represented by a single electrical node. A single electrical node thus corresponds to the logic value of a state bit.

A drawback of this single-rail technology is the fact that the circuit design or the signals processed in the circuit can easily be spied out. One of the most important methods for attacking circuits and for assessing the sensitivity thereof in security applications is differential power analysis (DPA). This method is used for deliberate attacks in order to spy out confidential information such as passwords or cryptographic keys, for example.

In this case, current profiles measured using statistical methods are evaluated for a given program or for a given algorithm. In particular, charge integrals calculated over one or more clock cycles are evaluated, in which case—if the program is executed a large number of times—the correlation between systematic data variation and the respective charge integral can be used to draw conclusions about the information which is to be protected.

It follows from this that the integrated circuits to be protected such as, for example, chip cards should be of such a type that they deliver the same current profile irrespective of the data to be processed, in order to cause differential power analysis to fail.

This is not the case for single-rail data paths. The charge integral associated with the time profile for the states of a circuit is a function of those nodes or electrical capacitances which undergo electrical charge reversal. The time profile is thus heavily dependent on the changes in the data to be processed over time.

Changing charge integrals can be prevented by using "dual-rail technology". In contrast to conventional single-rail technology, where each bit within a data or signal path is physically represented by a single electrical node k in a switching matrix or switching mechanism, the implementation using dual-rail technology involves each bit being represented by two nodes k and kq, with this bit having a valid logic value if k corresponds to the true logic value b for this bit and kq corresponds to the complementary value bn=not (b).

The desired invariance in the charge integrals is achieved in this case by virtue of a "precharge" state having been inserted between two states with valid logic values (b, bn)=(1,0) or (0,1). In this precharge state, both the node k and the node kq are charged to the same electrical potential and thus assume logically invalid values (1,1) or (0,0). For the precharge state (1,1), a state sequence could have the following appearance:

(1,1),(0,1),(1,1),(1,0),(1,1),(1,0),(1,1),(0,1) . . .

For any of such state sequences, it holds true that any (1,1) to (b,bn) transition involves a single node having its charge reversed from 1 to 0, and all (b,bn) to (1,1) states involve a single node having its charge reversed from 0 to 1. This is true irrespective of the logically valid value b of a respective state bit. Naturally, a similar situation also applies to state sequences having the precharge state (0,0).

It follows from this that the charge integrals corresponding to these state sequences are independent of the sequence (b,bn) of the logically valid values. It is merely necessary to ensure that the nodes k and kq have the same electrical capacitances. The current profile for a data path implemented in this way is thus no longer dependent on temporal variations in the data to be processed. A circuit designed using dual-rail technology is thus resistant to differential power analysis.

FIG. 1 shows an example of a single-bit register cell in which the data path has been designed using dual-rail technology and which has the minimum number (in the above sense) of four ports or switching devices.

The switching devices PA, PB are used to read out operands. The switching device PZ is used to write back an arithmetic result, and the switching device PC is used to load memory contents from outside the data path and to remove them to outside the data path.

Each of the switching devices PA, PB, PC, PZ is connected to a line pair comprising the lines BLi1, BLi2 (where i=a, b, c, z). Said line pairs constitute bit line pairs. A dual-rail signal bli, bliq (where i=a, b, c, z) can be applied to each of the line pairs. Also connected to a respective bit line pair BLi1, BLi2 (where i=a, b, c, z) is a respective precharging unit Va, Vb, Vc, Vz which can apply a precharge state to the respective bit line pair. The switching devices PA, PB, PC, PZ are actuated by means of control connections SA, SB, SC, SZ which are connected to a word line in the integrated circuit. A control signal wla, wlb, wlc, wlz can be applied to said word line.

Each of the switching devices PA, PB, PC, PZ comprises two transistors Tj, TjQ (where j=A, B, C, Z), the control connections on which are connected to one another and to the control connections SA, SB, SC, SZ. A respective main connection on the transistors Tj and TjQ is connected to one of the lines BLi1 and BLi2, while the other main connections are connected to an additional line pair having the lines L1 and L2.

The additional line pair is connected to a memory cell MC comprising two inverters which are connected back to back and have the transistors T1, T1Q and T2, T2Q. The memory cell is connected between an operating potential connection BP and a supply potential connection VP.

The switching devices PA, PB are operated as pure read ports. When the transistors TA, TAQ and TB, TBQ are closed, the two nodes which respectively correspond to the bit line pairs BLa1, BLa2 and BLb1, BLb2 are first of all precharged to a high potential level and are then disconnected from the precharging units Va, Vb provided in the peripheral area of the storage register. The respective transistors in the switching device PA, PB are closed by applying control signals wla, wlb having a low potential level, since the transistors in said switching devices are all of the n-conductive type. The bit line pairs BLa1, BLa2 and BLb1, BLb2 are at a high potential level even after disconnection from the precharging units Va, Vb. Since there is no longer any conductive connection to the supply potential connection of a supply voltage source, said bit line pairs BLa1, BLa2 and BLb1, BLb2 are now held only capacitively, that is to say in a floating manner, at this level. This state is designated (H, H) below.

If the transistors in the switching devices PA, PB are then turned on by means of suitable actuating signals wla, wlb, an electrical connection is produced between the additional line pair L1, L2 and the respective bit line pair. Since one of the lines L1, L2 (which are connected to the memory cell MC) is at a low potential, the bit line which is conductively connected thereto (by means of the transistor which is now open) is also discharged to a low potential. This means that the bits which are to be read out from the memory cell are on the respective bit line pairs BLa1, BLa2 and BLb1, BLb2.

It is assumed in the following text that the state (1,0) corresponds to the value 1 and the state (0,1) corresponds to the value 0. The states on the bit line pairs BLa1, BLa2 and BLb1, BLb2 can now be assumed by other parts of the data path. The control signals wla and wlb are simultaneously lowered to a low potential again in order to disconnect the memory cell MC from the bit line pairs again so that the latter can be prepared for the subsequent access operation.

In contrast, the switching device PZ is operated as a pure write port. When the transistors TZ, TZQ are closed, the bit to be written is first of all transferred, from the outside, onto the bit line pair BLz1, BLz2 before the control signal w/z is raised to a high potential level, as a result of which the lines L1, L2 are in turn connected to the bit line pair BLz1, BLz2 by means of the switching device PZ.

The capacitive voltage divider which exists immediately thereafter and generally has very high bit line capacitances in comparison with the capacitances within the cell—assisted by the external write circuit and the feedback within the cell—results in the potential's value (previously stored in the cell) being overwritten by the dual-rail signal blz, blzq applied to the bit line pair BLz1, BLz2. This means that the control signal w/z can be lowered to a low potential again in order to disconnect the memory cell MC from the bit line pair BLz1, BLz2 so that the latter can be prepared for the subsequent access operation.

It is not possible to tell, solely from the single-bit register cell shown in FIG. 1, which of the switching devices are used as read ports and which are used as write ports. This is determined by the externally impressed time response or by the actuation of the bit line pairs and the control connections on the switching devices.

The switching device PC which is operated as a write and read port therefore has both precharging and also writing and reading driver circuits associated with it in the peripheral area of the storage register. Said circuits, with the exception of the precharging unit Vc, are not shown in FIG. 1.

FIG. 2 shows, by way of example, the time response of the bit line pairs BLi1, BLi2, that is to say the timing of the dual-rail signals bli, bliq (where i=a, b, c, z) thereon and of the control signals wla, wlb, wlc, w/z at the respective control connections SA, SB, SC, SZ.

In phase (1), the binary value 0 is first of all loaded into the memory cell MC by means of the switching device PC. As long as the control signal wlc is equal to 0, the following dual-rail signal: (blc, blcq)=(0,1) is applied to the bit line pair BLc1, BLc2. If the state applied to this bit line pair is intended to be loaded into the memory cell MC, the control signal wlc is brought to the value 1. At this point in time, the lines L1, L2 are electrically connected to the bit line pair BLc1, BLc2, with the result that the following dual-rail state: (bit, bitq)=(0,1) is produced on the additional line pair L1, L2. After storage in the memory cell MC has been completed, the control signal wlc is lowered to 0 again.

In phase (2), the value stored in the memory cell MC is read out by means of the switching device PA. Before the reading-out operation, the bit line pair BLa1, BLa2 is put into a precharge state so long as the control signal wla is equal to 0. This means that the following signal: (bla, blaq)=(1,1) is present on both lines. After the bit line pair BLa1, BLa2 has been isolated from the supply potential by means of the precharging unit Va, the abovementioned dual-rail signal now remains only capacitively at the high potential level. Application of the control signal wla=1 produces an electrical connection to the additional line pair L1, L2, as a result of which the line BLa1 or the potential stored thereon adjusts to the potential on the line L1 and accordingly falls to 0. The same dual-rail signal as on the additional line pair L1, L2 is now applied to the bit line pair BLa1, BLa2.

In phase (3), the binary value 1 (corresponding to (1,0)) is written to the memory cell MC. A precharge phase is first of all implemented on the signal line pair BLz1, BLz2, so that the two lines have the value 1. The line BLz2 is then brought to a low potential, so that the value blzq=0 is applied to this line. During this time, the control signal wlz is at a low signal level. In order to write the dual-rail signal to the memory cell MC, the control signal wlz is brought to a high signal level, as a result of which the potentials are aligned by virtue of the conductive connection between the bit line pair and the additional line pair L1, L2. Following the write operation, the control signal wlz is brought to a low signal level again, as a result of which the conductive connection between the line pair BLz1, BLz2 and the additional line pair L1, L2 is cleared.

In phase (4), this value is read out again by means of the switching device PB. Before the control signal wlb is brought to a high signal level, the bit line pair BLb1, BLb2 is precharged to the value (1,1) and the electrical connection to the supply potential connection is then severed by means of the precharging unit Vb, with the result that the potential values are capacitively stored on the bit line pair. After the control signal wlb=1 has been applied, the potentials on the bit line pair and the additional line pair L1, L2 are gradually aligned, with the result that the following state is achieved: (blb, blbq)=(1,0). This corresponds to (bit, bitq)=(1,0).

In phase (5), the cell contents are finally removed by means of the switching device PC. This means that (blc, blcq)=(hh) before wlc=1. As a result, (blc, blcq)=(bit, bitq) (1,0).

Although the single-bit register cell shown in FIG. 1 has been provided with dual-rail connections which are respectively precharged to a high potential level before and between the access operations, its charge flow is data-independent only for read access operations.

In comparison, for write access operations, the charge integral depends on whether or not the value which has been supplied externally by means of the bit line pair and is to be newly written to the cell matches the old value which was previously stored in the cell. In the first case, the charges of the capacitances of the additional line pair L1, L2, that is to say the cell nodes (bit, bitq), need not be reversed, but they must in the second case.

SUMMARY OF THE INVENTION

The object of the present invention therefore involves specifying an integrated circuit in which the charge integral is data-independent even in the case of write access operations.

This object is achieved with an integrated circuit and method having the features of the independent claims. Advantageous refinements can respectively be found in the dependent claims.

The inventive integrated circuit has the following features:

at least one line pair to which a dual-rail signal can be applied, a switching device which is connected to the line pair, can be controlled by means of a signal applied to a control connection and can be used to transmit the dual-rail signal—which has been applied to the line pair—to an additional line pair, and a memory cell which is connected to the additional line pair, with the memory cell being connected to a supply potential connection by means of a controllable switch.

The operation of writing to the memory cell takes place in two substeps by virtue of the provision of a controllable switch between the memory cell and a supply potential connection. The additional line pair is first of all precharged to a first signal value by means of the switching device and the line pair (bit line pair). This means nothing other than that a precharge signal is applied to the additional line pair constituting the nodes in the memory cell.

This is preferably effected in such a manner that the precharging unit connected to the line pair is activated and the memory cell is simultaneously disconnected from the supply potential. In the next step, one of the lines in the additional line pair is charged to a second signal value. This is the actual write operation. Finally, the line pair and the additional line pair are electrically isolated from one another by means of the switching device, and the memory cell is simultaneously connected to the supply potential by means of the controllable switch. As a result of this step, that line in the memory cell which has been brought to a high potential level externally is charged to its final value, which ends the write operation.

In one preferred refinement, the memory cell has inverters which are connected back to back.

The switching device is preferably formed from two transistors, the control connections on which are connected to that control connection which is connected to a word line in the integrated circuit. The signal applied to the control connection determines whether or not the bit line pair connected to the switching device is connected to the additional line pair.

In another refinement of the invention, a precharging unit for precharging the line pair is connected to the line pair. If the integrated circuit has a plurality of line pairs, each line pair is preferably connected to its own precharging unit. In the simplest case, each precharging unit comprises two transistors, one of which is connected between a line in the bit line pair and a reference ground or supply potential connection and the other of which is connected between the other line in the bit line pair and the reference ground or supply potential connection.

In one refinement of the invention, a value is written to the memory cell by means of the line pair and the switching device. In this case, the precharging unit precharges the line pair to a first signal value.

In another refinement, a value stored in the memory cell is read out by means of the line pair and the switching device. In this variant, the precharging unit precharges the line pair to a second signal value.

The invention also provides such line pairs as can be used to write a value to the memory cell and to read out the value stored in the memory cell by means of the line pair and the switching device. In this variant, there is a holding device which is connected to the line pair and stores the signal values (particularly the precharge states selected) for the line pair until the next type of access operation has been settled. Alternatively, the precharging unit can precharge the line pair deterministically.

Whereas unambiguous precharge states can be assigned to pure write and read ports, this does not apply to write/read ports and bit line pairs. It is necessary to precharge to a first signal value before writing and for the purpose of writing, and a precharge state having a second signal value is required before reading. This raises the question as to which state such bit line pairs are to assume after the conclusion of any access operation if it is not yet known what type of access operation is supposed to take place next and when it is supposed to take place.

This is an appropriate situation for the abovementioned options of using a suitable holding circuit to first of all keep the bit line pair at the value which was last read or written until it is clear what type of access operation will take place next. Only then is the respectively required precharging operation carried out. This variant has the advantage of low power consumption.

Alternatively, the bit line pair can be precharged deterministically. If the precharge state is not suited to the subsequent access operation, however, the charge must, if appropriate, be reversed to the respective other precharge state in good time. If the type of the next access operation is unknown, the precharge state can also be decided by means of a random bit (which is supplied to the control logic unit) in the storage register. This has the advantage of masking the current profile, which makes it more difficult to use the charge integral to draw conclusions about the type of access operations.

Finally, depending on the requirement imposed on the desired level of security and on the power consumption, the integrated circuit may be operated with the aid of the holding circuit or the deterministic procedure.

In another advantageous refinement of the invention, the control connections on the controllable switch for the memory cell and on the switching device are connected to one another. However, this applies only to those switching devices which have only write access to the memory cell. As a result, the integrated circuit can dispense with part of the actuating system, which means that it can be integrated on a smaller surface area. If the storage register has more than one pure write port, it is advantageous if as many controllable switches as there are pure write ports are connected in series between the memory cell and the supply potential connection. The control connection on each of these controllable switches is then connected to the control connection associated with the respective switching device.

BRIEF DESCRIPTION OF THE DRAWINGS

Further advantages, features and expediencies of the invention and also its method of operation are explained in more detail with reference to the exemplary embodiment described below. In the drawings.

DETAILED DESCRIPTION OF THE PREFERRED MODE OF THE INVENTION

Figure 1:
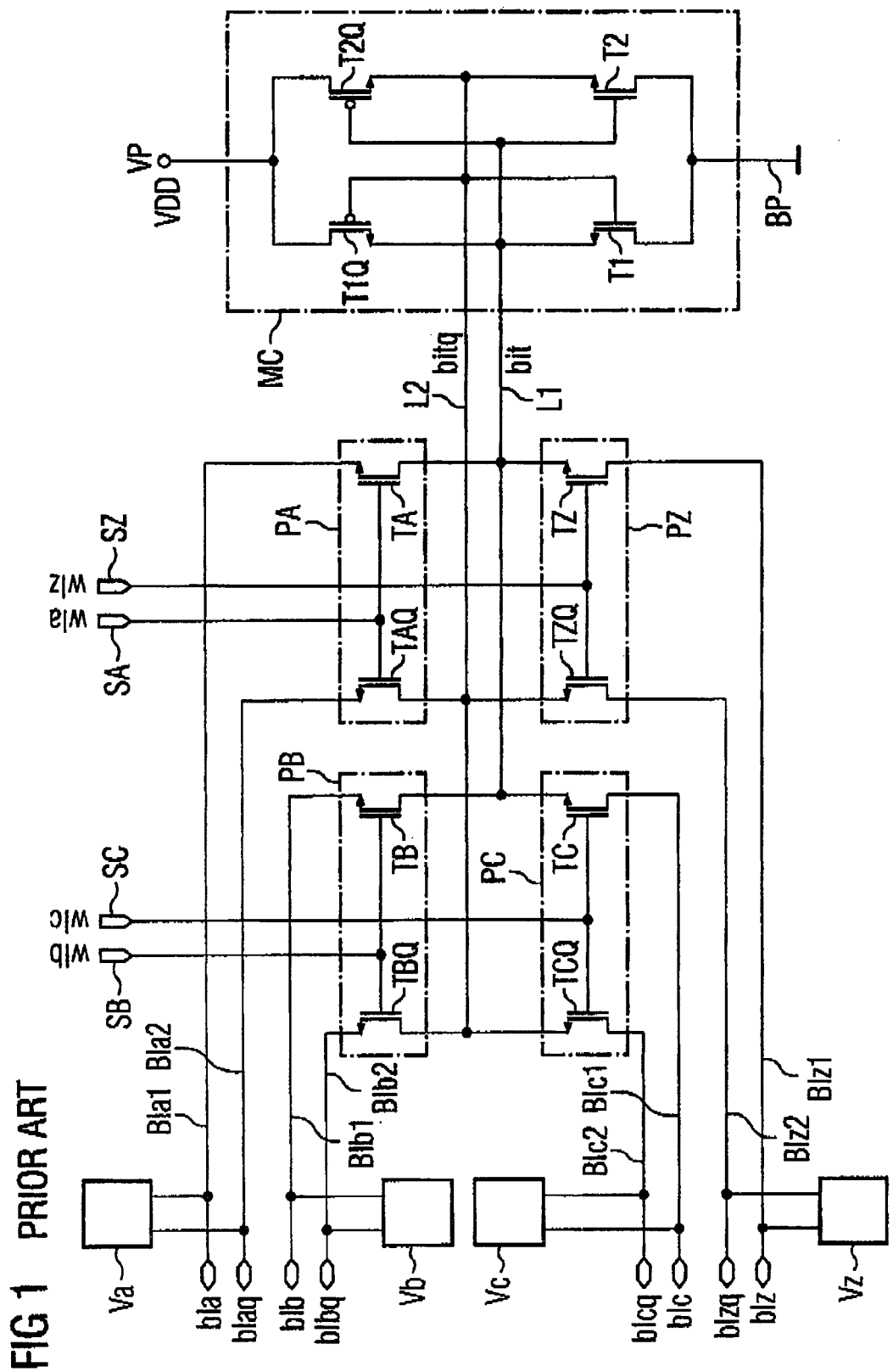
FIG. 1 shows a single-bit register cell which is known from the prior art and uses dual-rail technology.
Figure 2:
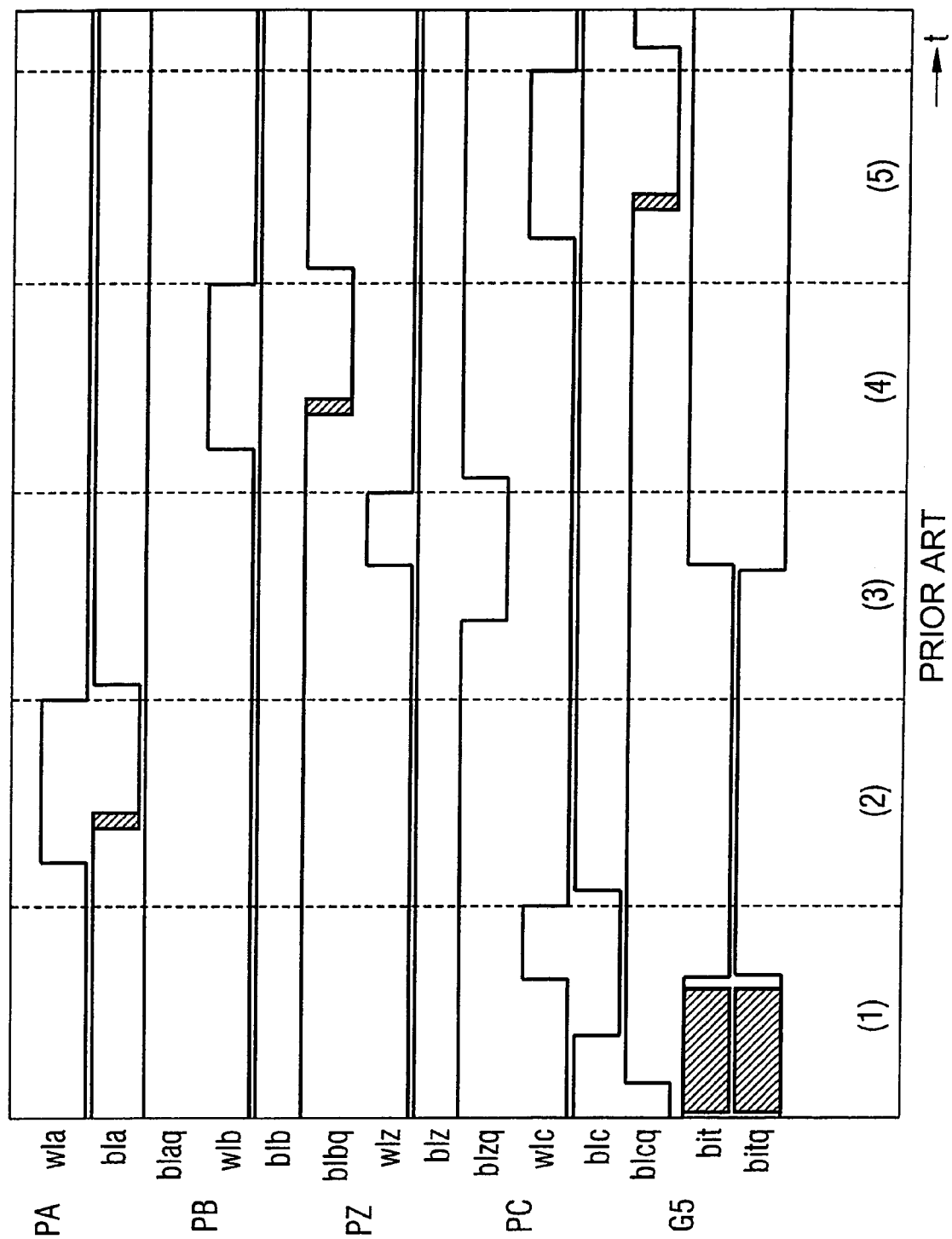
FIG. 2 shows the time response of the integrated circuit shown in FIG. 1.

FIGS. 1 and 2 have already been explained in the introduction, with the result that they will not be described again at this juncture.

Figure 3:
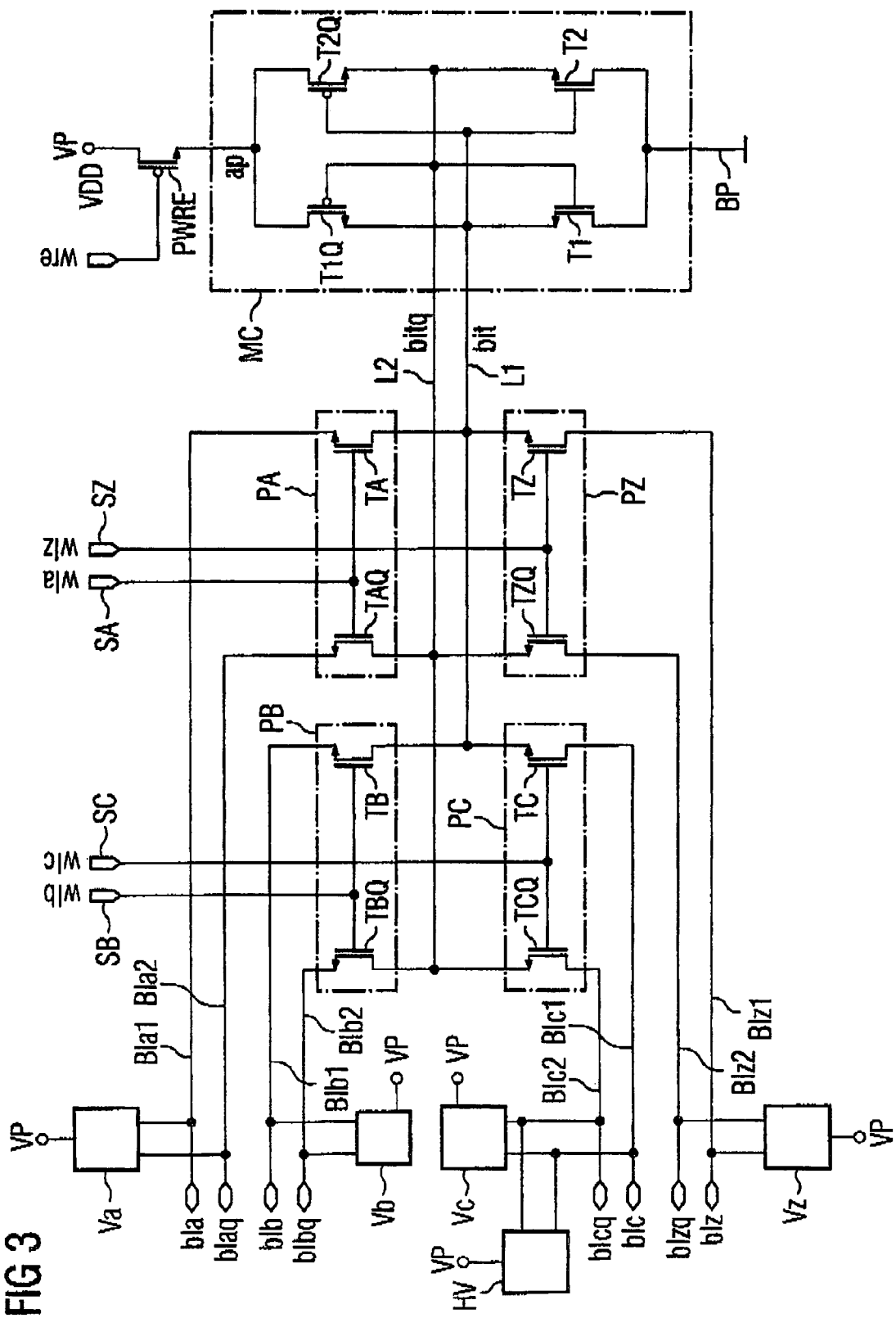
FIG. 3 shows an inventive single-bit register cell using dual-rail technology.

FIG. 3 shows an inventive single-bit register cell which uses dual-rail technology and has a data-independent charge integral even in the case of write access operations. The circuit design of the inventive register cell essentially corresponds to that in FIG. 1. One difference is that there is a controllable switch PWRE between the memory cell MC at node ap and a supply potential connection VP, with it being possible to apply a control signal wre to the control connection on said controllable switch. Furthermore, in addition to the arrangement shown in FIG. 1, there is a holding device HV which is electrically connected to the bit line pair BLc1, BLc2 and thus to the switching device PC. This bit line pair is a port which can be used to provide both read and write access to the contents of the memory cell MC. As in the exemplary embodiment shown in FIG. 1, the bit line pairs BLa1, BLa2 and BLb1, BLb2 connected to the switching devices PA, PB are ports which can be used to read out contents from the memory cell MC. Finally, data can be written to the memory cell by means of the switching device PZ and the bit line pair BLz1, BLz2 connected thereto.

Figure 4:
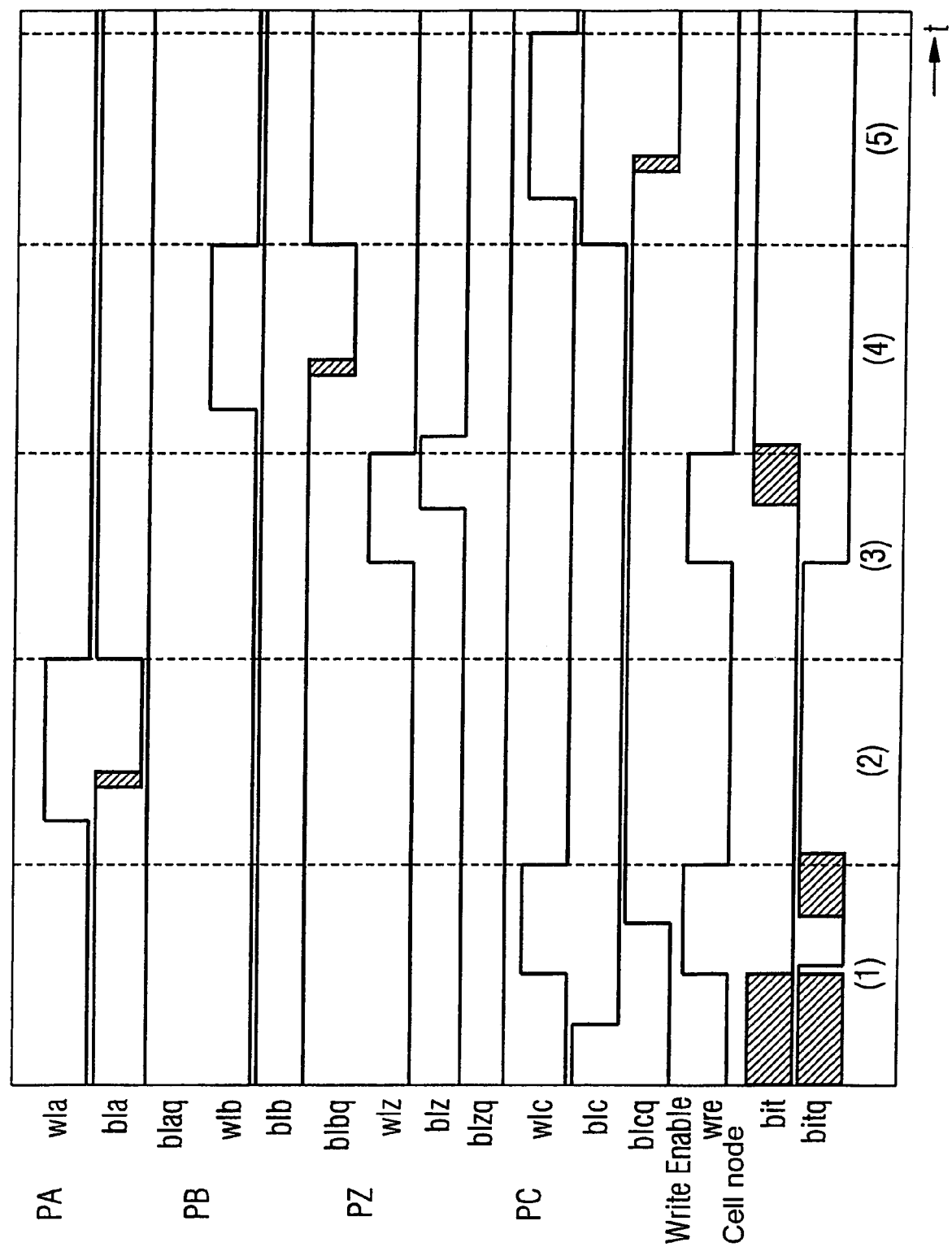
FIG. 4 shows the timing of the signals occurring in the integrated circuit shown in FIG. 3.

The timing of the signals is described by way of example with reference to FIG. 4.

In phase (1), the binary value 0 (corresponding to (0,1)) is to be loaded into the inventive single-bit register cell by means of the switching device PC. To this end, the bit line pair BLc1, BLc2 is first of all brought to a low potential level (blc, blcq)=(0,0). A short time later, the control signals blc and wre are simultaneously raised to a high potential level (VDD), that is to say the transistors in the switching device PC are turned on and the controllable switch PWRE is switched off. This causes the memory cell (which comprises feedback inverters) to be disconnected from the supply voltage. This results in the signals bit, bitq which are applied to the additional line pair LA1, LA2 being lowered to the potential blc, blcq. This means that the charge which was previously stored on the additional line pair L1, L2 is dissipated without it being possible for short-circuit currents to flow via the memory cell.

The actual write operation does not begin until after this has been effected in full:

In accordance with the value 0 to be written to the register cell, the line BLc2 to which the signal blcq is applied is raised to a high potential level, as a result of which, on account of the transistor TCQ which is still on, the line L2 is charged to the same high potential level minus a threshold voltage of the transistor TCQ. The signal bitq applied to the line L2 has thus not yet reached the final value, this being shown in FIG. 4 by means of the gray-colored area at the end of phase (1). The lines BLc1 and L1 in the additional line pair remain at a low signal level in accordance with the value 0 to be stored.

At the end of phase (1), the control signals wlc and wre are simultaneously lowered to a low signal level, that is to say the transistors in the switching device PC are turned off, while the controllable switch PWRE is switched on. As a result, the cell nodes of the additional line pair L1, L2 are isolated from the bit line pair BLc1, BLc2, and the memory cell MC is connected to the supply voltage. This results in the signal value bitq applied to line L2 being charged to the full potential value VDD, which ends the write operation.

In phase (2), the value 0, that is to say (bit, bitq)=(0,1), stored in the memory cell MC is read out by means of the switching device PA and the bit line pair BLa1, BLa2 connected thereto. Achieving charge neutrality first of all requires that the precharging device Va be used to precharge the bit line pair to the precharge state (1,1). The potential stored on the bit line pair is finally now present only capacitively, since the precharging unit Va isolates the bit line pair from the supply potential connection VP. Following this operation, the control signal wla is brought to a high potential, as a result of which the bit line pair BLa1, BLa2 enables a conductive connection to the additional line pair L1, L2. After some time, a signal value (bla, blaq)=(bit, bitq)=(0,1) corresponding to the additional line pair L1, L2 becomes established on the bit line pair BLa1, BLa2.

Finally, the conductive connection between the bit line pair and the additional line pair L1, L2 is severed again by bringing the control signal wla to a low potential again, as a result of which the transistors in the switching device PA are off again.

In phase (3), the binary value 1 is written in a charge-neutral manner to the memory cell MC by means of the switching device PZ. A precharge state is first of all implemented on the bit line pair BLz1, BLz2 by respectively bringing the control signals w/z and wre to a low signal level. In this case, the precharge state is (0,0). It is possible, by simultaneously raising the control signals wlc, wre to high signal levels, for the binary value 1 (blz, blzq)=(1,0) to be present on the bit line pair BLz1, BLz2 after a short time. Since, at this point in time, a conductive connection to the additional line pair L1, L2 has already been established, line L1 is charged to a high signal value VDD which has been reduced by the threshold voltage of the transistor TC. Line L2 remains at a low potential. In order to conclude the write operation, the control signals wlz, wre are brought to a low signal level again, as a result of which the transistor PWRE applies the supply potential to the memory cell. On account of the latter being connected as feedback inverters, a signal bit corresponding to the supply potential VDD may become established on the line L1.

In phase (4), the value read into the memory cell is read out again by means of the switching device PB. In this case too, the reading-out operation takes place in a charge-neutral manner by virtue of the precharging unit Vb being used to bring the bit line pair BLb1, BLb2 to high signal values. After the bit line pair BLb1, BLb2 has been disconnected from the supply potential connection VP, the potential stored thereon is retained for the time being. For the reading-out operation, the control signal wlb is brought from a low to a high signal level, with the result that the bit line pair BLb1, BLb2 and the additional line pair L1, L2 are conductively connected. After some time, the signal value applied to the line L2 becomes established on the line BLb2. This means that (blb, blbq)=(bit, bitq)=(1,0).

Finally, in phase (5), the cell contents of the memory cell MC are removed by means of the switching device PC. This operation, too, takes place in a charge-neutral manner by first of all putting the bit line pair BLc1, BLc2 into a precharge state (1,1). After the bit line pair has been disconnected from the supply potential connection VP, the potential remains capacitively stored on the lines. When the control signal wlc is changed from a low to a high signal level, the value stored in the memory cell is read out by means of the bit line pair BLc1, BLc2: (blc, blcq)=(bit, bitq)=(1,0). At the end of phase (5), the control signal blc is brought to a low signal level again, with the result that the conductive connection between the bit line pair and the additional line pair or the memory cell MC has been severed.

The exemplary time profile for the signals in the integrated circuit was used to make it clear that charge neutrality prevails irrespective of the manner in which a value is read out from, or stored in, the memory cell. Said charge neutrality is caused by a merely minor physical change.

The holding circuit shown in FIG. 3 is used to keep the precharge state (which is stored on the bit line pair BLc1, Blc2) until it is clear what type of access operation will take place next. Only then is the required precharging operation carried out. The result of the holding circuit is thus that, for a switching device which is used to provide both read and write access to the memory cell, it is not possible to assign an unambiguous precharge state. The precharge state (0,0) must be selected before writing and for the purpose of writing, while the precharge state (1,1) is required before reading. The holding circuit is intended to make it possible to select the appropriate precharge state in a simple manner.

The invention claimed is:

1. An integrated circuit comprising:
   at least one line pair to which a dual-rail signal is applied;
   a switching device, which is connected to the at least one line pair, being controlled via a signal applied to a first control connection and used to transmit the dual-rail signal, which has been applied to the at least one line pair, to an additional line pair;
   a memory cell connected to the additional line pair and connected to a supply potential connection via a controllable switch; and
   a holding device connected to the at least one line pair and storing the signal values for the at least one line pair until a next type of access operation has been settled.

2. The integrated circuit as claimed in claim 1, wherein the memory cell has inverters connected back to back.

3. The integrated circuit as claimed in claim 1, wherein the switching device has two transistors with second control connections connected to the first control connection which is connected to a word line in the integrated circuit.

4. The integrated circuit as claimed in claim 1, wherein the at least one line pair constitutes a bit line pair in the integrated circuit.

5. The integrated circuit as claimed in claim 1, wherein a precharging unit for precharging the at least one line pair is connected to the at least one line pair.

6. The integrated circuit as claimed in claim 5, wherein a value is written to the memory cell via the at least one line pair and the switching device.

7. The integrated circuit as claimed in claim 6, wherein the precharging unit precharges the at least one line pair to a first signal value.

8. The integrated circuit as claimed in claim 6, wherein a third control connection on the controllable switch for the memory cell and the first control connection on the switching device are connected to one another.

9. The integrated circuit as claimed in claim 5, wherein a value stored in the memory cell is read via the at least one line pair and the switching device.

10. The integrated circuit as claimed in claim 9, wherein the precharging unit precharges the at least one line pair to a second signal value.

11. The integrated circuit as claimed in claim 5, wherein a value is written to the memory cell, and the value stored in the memory cell is read from the memory cell, via the at least one line pair and the switching device.

12. The integrated circuit as claimed in claim 11, wherein the precharging unit precharges the at least one line pair deterministically.

13. A method for operating an integrated circuit as claimed in claim 5, comprising the steps of:
   precharging the additional line pair to a first signal value via the switching device and the at least one line pair;
   charging one of the lines in the additional line pair to a second signal value; and
   electrically isolating the at least one line pair and the additional line pair from one another via the switching device, wherein the memory cell is simultaneously connected to the supply potential via the controllable switch.

14. The method as claimed in claim 13, wherein the step of precharging the additional line pair includes the steps of activating the precharging unit which is connected to the at least one line pair and disconnecting the memory cell from the supply potential.

15. An integrated circuit comprising:
   at least one line pair to which a dual-rail signal is applied;
   a switching device, which is connected to the at least one line pair, being controlled via a signal applied to a first control connection and used to transmit the dual-rail signal, which has been applied to the at least one line pair, to an additional line pair; and a memory cell connected to the additional line pair and connected to a supply potential connection via a controllable switch, wherein the switching device has two transistors with second control connections connected to the first control connection which is connected to a word line in the integrated circuit.

* * * * *